(12) United States Patent
D'Angella et al.

(10) Patent No.: US 11,547,009 B2
(45) Date of Patent: Jan. 3, 2023

(54) ADAPTIVE TRANSCEIVER POWER SUPPLY

(71) Applicants: Domenic D'Angella, Germantown, MD (US); Eric Maksymyk, Merritt Island, FL (US)

(72) Inventors: Domenic D'Angella, Germantown, MD (US); Eric Maksymyk, Merritt Island, FL (US)

( * ) Notice: Subject to any disclaimer, the term of this patent is extended or adjusted under 35 U.S.C. 154(b) by 126 days.

(21) Appl. No.: 16/900,929

(22) Filed: Jun. 14, 2020

(65) Prior Publication Data

US 2021/0329803 A1    Oct. 21, 2021

Related U.S. Application Data

(60) Provisional application No. 62/921,475, filed on Jun. 20, 2019.

(51) Int. Cl.
*H02J 7/00* (2006.01)
*H05K 5/02* (2006.01)
*H05K 5/00* (2006.01)

(52) U.S. Cl.
CPC .......... *H05K 5/0247* (2013.01); *H02J 7/0042* (2013.01); *H05K 5/0086* (2013.01)

(58) Field of Classification Search
None
See application file for complete search history.

(56) References Cited

U.S. PATENT DOCUMENTS

| | | | | |
|---|---|---|---|---|
| 6,038,130 A * | 3/2000 | Boeck | ................... | H02B 1/052 361/732 |
| 6,784,570 B1 * | 8/2004 | Walls | ................... | H02J 7/0044 320/107 |
| 10,118,574 B2 * | 11/2018 | Dietrich | ............... | H01R 31/005 |
| 2009/0168370 A1 * | 7/2009 | Perkins, III | .......... | H05K 5/0247 361/729 |
| 2013/0278090 A1 * | 10/2013 | Matsuo | .................. | H02K 5/203 310/54 |
| 2016/0099575 A1 * | 4/2016 | Velderman | .............. | H02J 7/342 320/113 |
| 2018/0205321 A1 * | 7/2018 | D'Angella | ............ | H02J 7/0068 |
| 2018/0299370 A1 * | 10/2018 | Preischel | ............... | H05K 1/142 |
| 2020/0313455 A1 * | 10/2020 | Adamany | ............... | F02N 11/12 |

* cited by examiner

*Primary Examiner* — Xanthia C Cunningham

(57) ABSTRACT

An improved power supply for the AN/PRC-117G military radio has been developed. The presently disclosed power supply includes an AC-DC power conversion module; a DC-DC power module and an onboard battery backup. The disclosed power supply is an adaptable power supply which configures to provide AC-DC power; DC only power and battery backup power. The AC and DC power modules are independent and separable, and may be configured by the radio user to remove the AC module and operate in a DC only mode. The adaptability of the power supply includes universal power supply for the Harris Corporation Falcon III series of radios which includes the AN/PRC-117G; RF-7800H-MP; RF-7800M-MP; RF-7800-RC; AN/PRC-160 and the RF-7800-RT intelligence, surveillance and reconnaissance terminal.

17 Claims, 7 Drawing Sheets

ADAPTIVE TRANSCEIVER POWER SUPPLY

BACKGROUND

The U.S. military employs a type of radio transceiver known as the AN/PRC-117G. The AN/PRC-117G is used in line of sight, and non-line of sight modes and can be carried by an individual, mounted in vehicles or mounted at a fixed sight. The AN/PRC-117G's design includes several related radios which use the same specifications for power input these radios include the RF-7800H-MP; RF-7800M-MP; RF-7800-RC; AN/PRC-160 and the RF-7800-RT intelligence, surveillance and reconnaissance terminal. These radios are manufactured by Harris Corporation and are widely used within the U.S. military for commonality between air, ground and naval forces. In the manpack mode the AN/PRC-117G is attached to a portable lithium battery which provides the radio's power. The lithium battery has a fixed life measured in hours and must be replaced. When used in a vehicle, aircraft, vessel or fixed installation the AN/PRC-117G and related radios use a power supply which is also known as a battery eliminator. The power supply eliminates the need for the manpack battery and can use global AC or DC power and convert the power to the correct voltage and current for the radio. Currently, existing AN/PRC-117G power supplies are manufactured as a unitary design. This design provides an AC conversion function integrated into the design and the AC conversion module is not separable from the DC conversion function. In applications such as vehicles, aircraft and vessels where the AC conversion function is not needed the current power supply is inseparable from the functionality. Existing AN/PRC-117G power supply designs have fixed cable connections which limit installation and design. The cable connectors on existing designs are on one side of the power supply and are fixed. For installations where cable connections are made from the opposite side installation requires complex cable routing and connections and increases strain on both the cables and the connectors.

SUMMARY

In some aspects, the invention relates to an AC-DC power supply for the AN/PRC-117G radio by providing DC output power for the radio by converting either AC or DC input power into useable power by the radio. Said power supply supports the AN/PRC-117G radio by removing the battery pack and attaching the power supply, also known as a battery eliminator. The said power supply is a modular power supply with modules separable and distinct and includes a first power module which receives AC input and converts AC power to DC power. A second power module receives DC input and converts the DC input to DC output suitable for the AN/PRC-117G radio. An onboard battery backup provides backup power when both external AC and DC power is lost.

In some aspects, the invention relates to an uninterruptable power supply by taking either AC or DC power input and charging the onboard battery pack and providing automatic switchover to battery backup when external power is lost.

In some aspects the invention relates to a DC power supply by removing the AC power conversion module and using the power supply in a DC only configuration.

In some aspects the invention relates to an power supply adapter comprising a removable and replaceable modular adapter which allows use with the Falcon III based series of radios including the RF-7800H-MP; RF-7800M-MP; RF-7800-RC; AN/PRC-160 and the RF-7800-RT intelligence, surveillance and reconnaissance terminal.

BRIEF DESCRIPTION OF DRAWINGS

It should be noted that identical features in different drawings are shown with the same reference numeral. Left side or right side is depicted as the user would be looking at the front of the radio with power supply.

DETAILED DESCRIPTION

Figure 1:
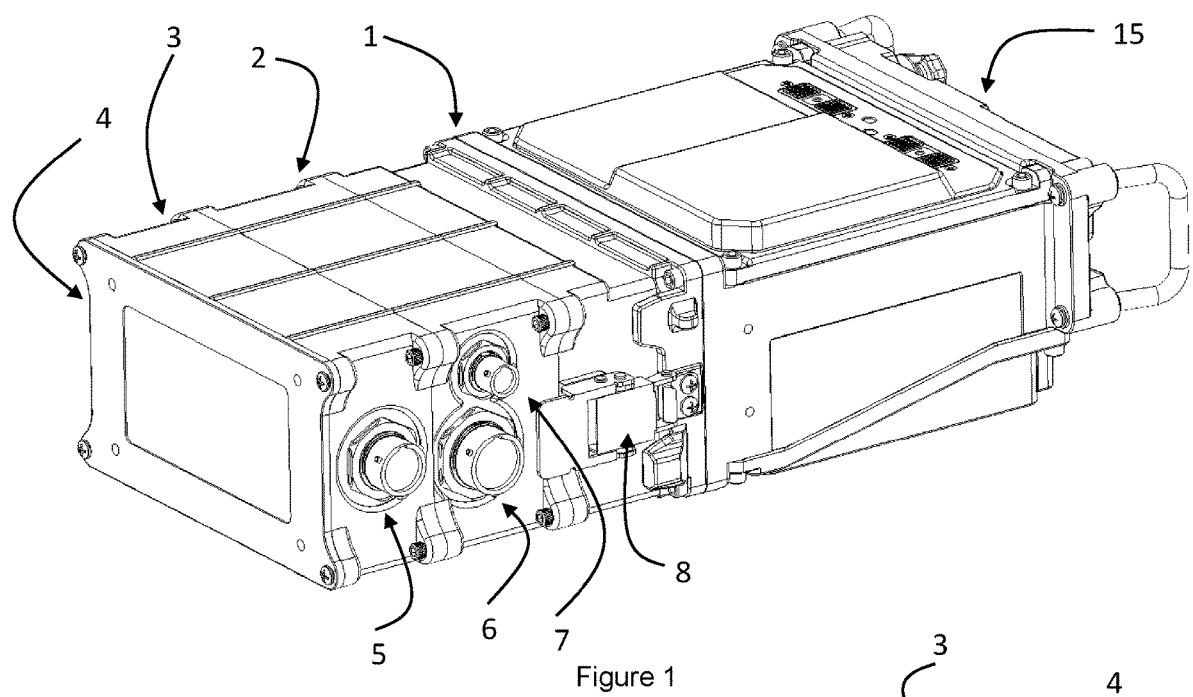
FIG. 1 is a perspective view of one embodiment of the present invention showing a Harris AN/PRC-117G radio.

An exemplary embodiment of the present invention is illustrated in FIGS. 1-11, where like portions share like numbering and left side or right side is depicted as if the viewer was looking at the radio with power supply connected from the front. As illustrated in FIG. 1 an embodiment including an adapter assembly 1, a first DC and battery module 2, a AC module 3 and a back plate 4 with first AC connector 5, first DC connector 6, and first auxiliary connector 7 configured for left side connections. The adapter is affixed to the AN/PRC-117G, 15, radio with latches 8. In the present embodiment shown in FIGS. 1 and 2 a power supply may consist of modules 1,2,3 and 4 affixed by screws 10. An embodiment of the power supply may consist of modules, 1,2 and 4 affixed by screws 10.

Figure 3:
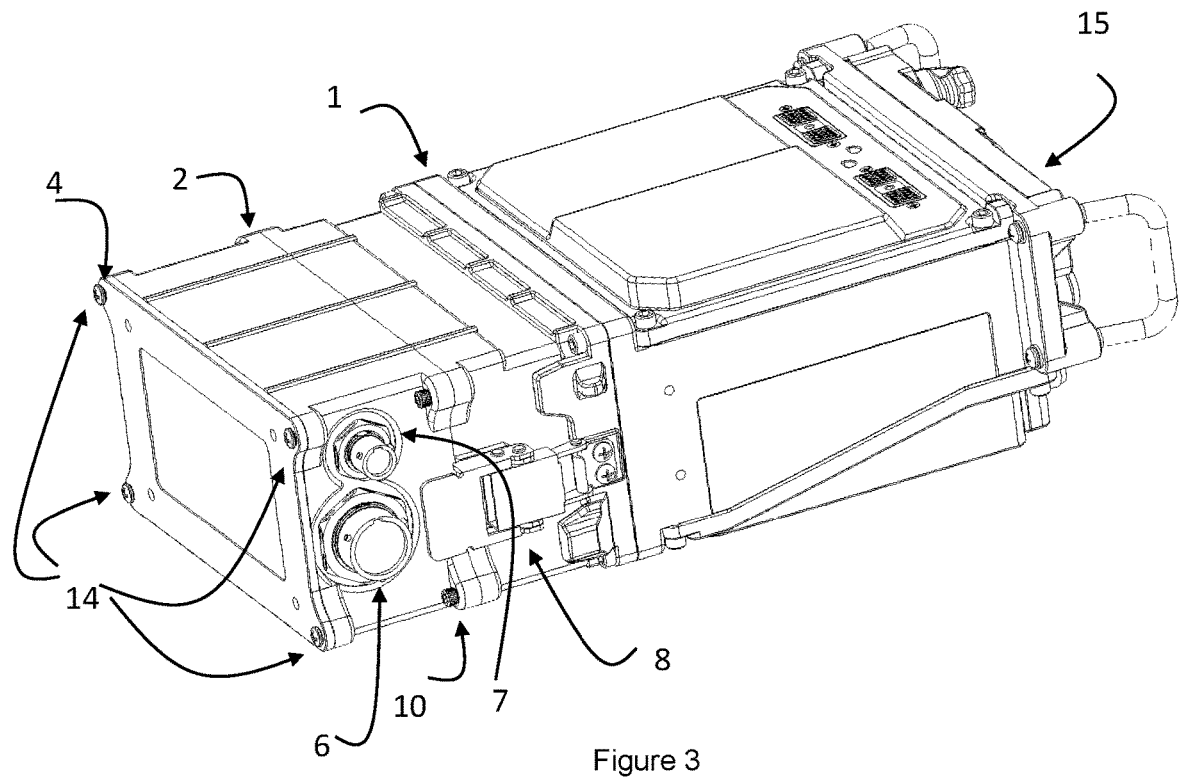
FIG. 3 is a left side elevation view with the Harris AN/PRC-117G radio.
Figure 4:
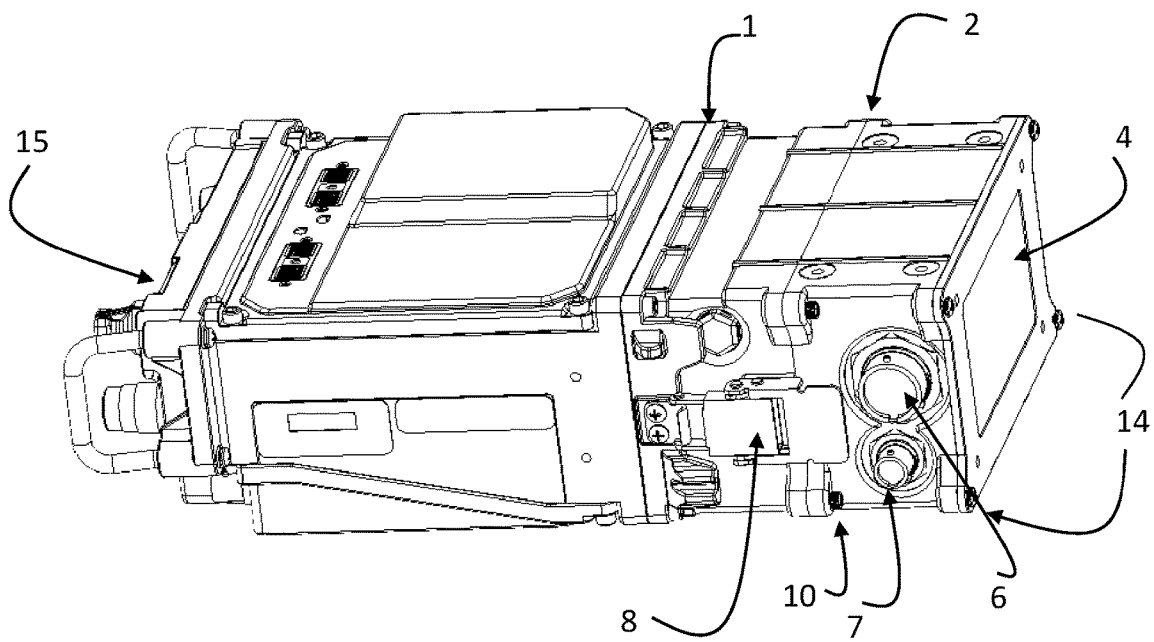
FIG. 4 is a right side elevation view with the Harris AN/PRC-117G radio.

Referring now to FIGS. 3 and 4 where the first DC module 2, and the backplate 4 is secured to the adapter module 1 with screws 10 and latches 8. The AC module 3, is removed in this embodiment while still allowing DC and battery functionality of the power supply. The embodiment shown in FIG. 3 is DC module 2 with connectors 6,7, on the left side. The embodiment shown in FIG. 4 is DC module 2 with connectors 6,7 on the right side. In this exemplary embodiment the backplate 4 is removed from the first AC module 3 and reinstalled on the first DC module 2. When the AN/PRC-117G in installed by latches 8 the J4 DC connector 11 is positioned in line with the radio DC power input connector. When DC module 2 is rotated so that the first DC input connector 6 and the first auxiliary connector 7 are rotated the J4 DC input connector remains fixed in line with the AN/PRC-117G.

Figure 5:
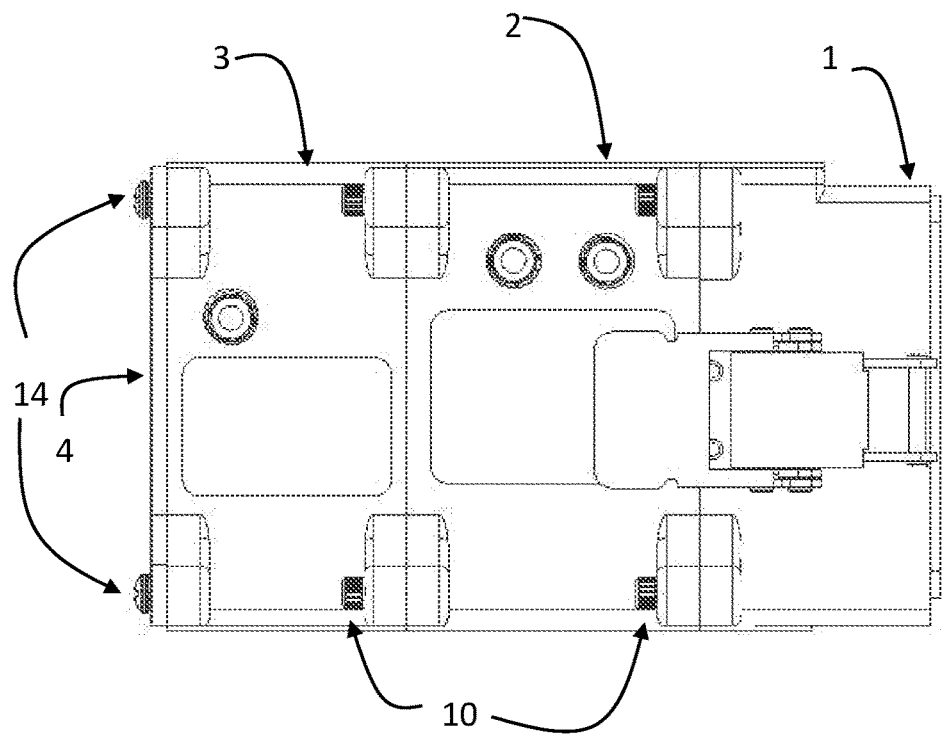
FIG. 5 is a left side elevation view.
Figure 6:
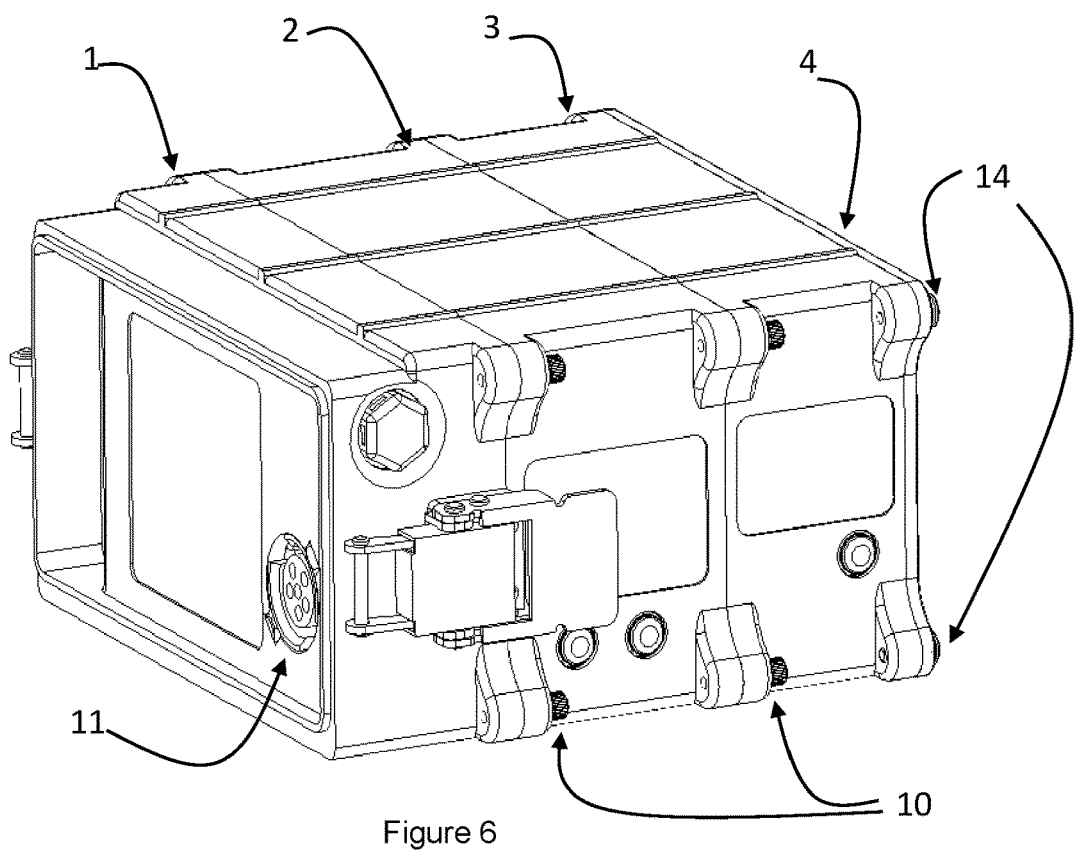
FIG. 6 is a right side elevation view.

Referring now to FIGS. 5 and 6 where the first DC module 2 is connected to the first AC module 3 and affixed to the adapter module 1. The adapter module 1 remains fixed while the first DC module 2 and the first AC module 3 are removed from the adapter module 1 and rotated 180 degrees moving the first AC connector 5, the first DC connector 6 and the first auxiliary connector 7 from left side connection to right side connection. AC LED indicator light 13 and DC indicator lights 12 are inverted.

Figure 7:
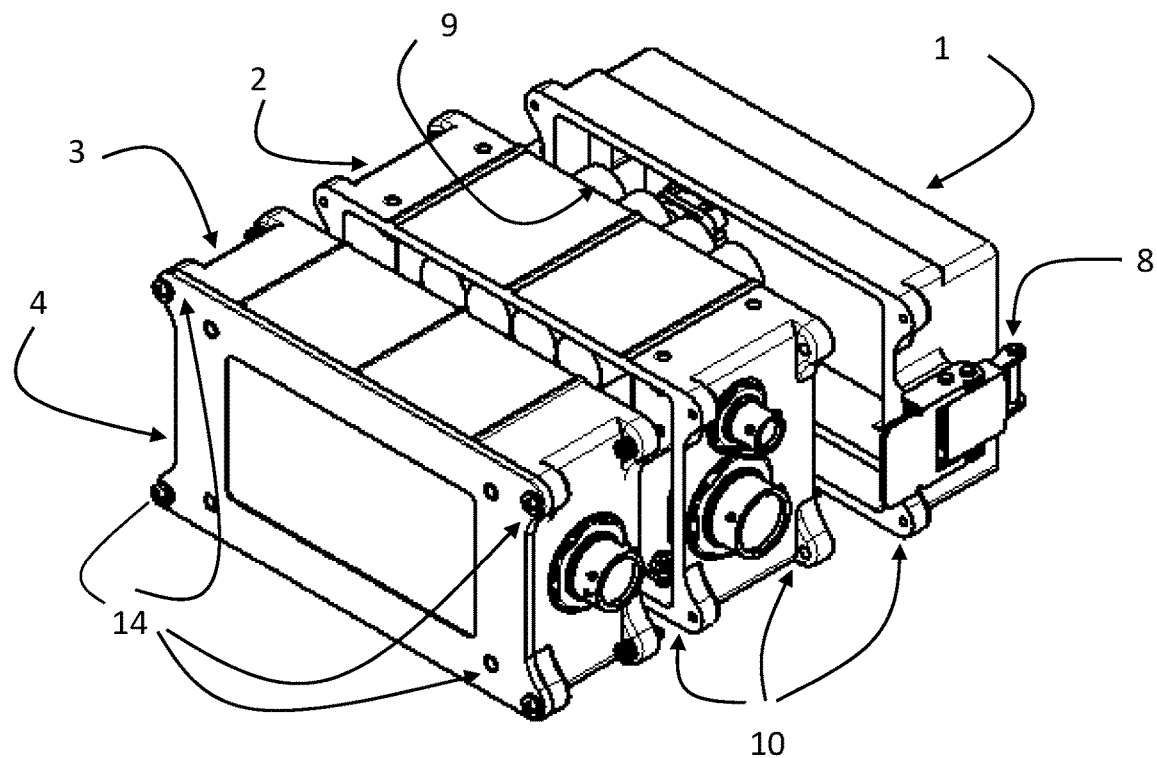
FIG. 7 is a top elevation view.
Figure 8:
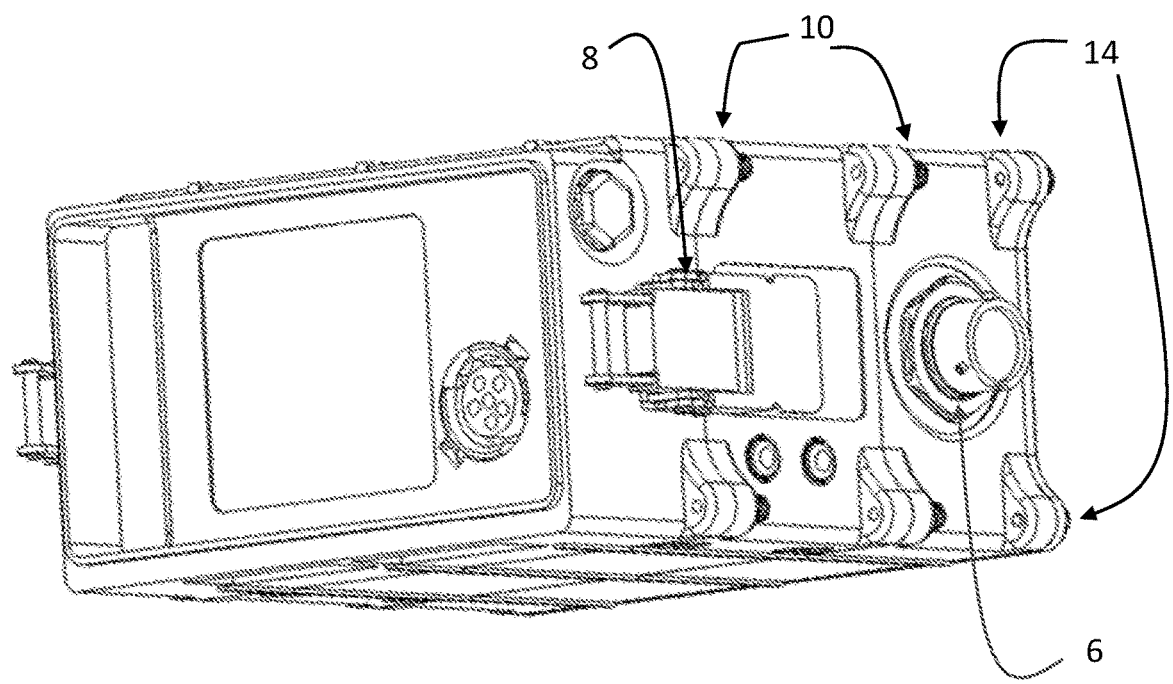
FIG. 8 is a side elevation view.

Referring now to FIGS. 7 and 8 a first DC module has a first battery pack unit installed. The battery pack provides onboard backup power if external power is disrupted and the onboard battery pack 9 is charged through a circuit from DC module 2 from AC or DC power. LED light 12 indicates battery charging and DC power on. The first AC module 3 is rotated 180 degrees from a left side connection to a right side connection while the first DC module 2 remains fixed in a left side connection providing a means to connect AC power, connector 5, from the right side of the radio and DC power, connector 6, or auxiliary power out, connector 7, on the left side of the power supply.

Figure 9:
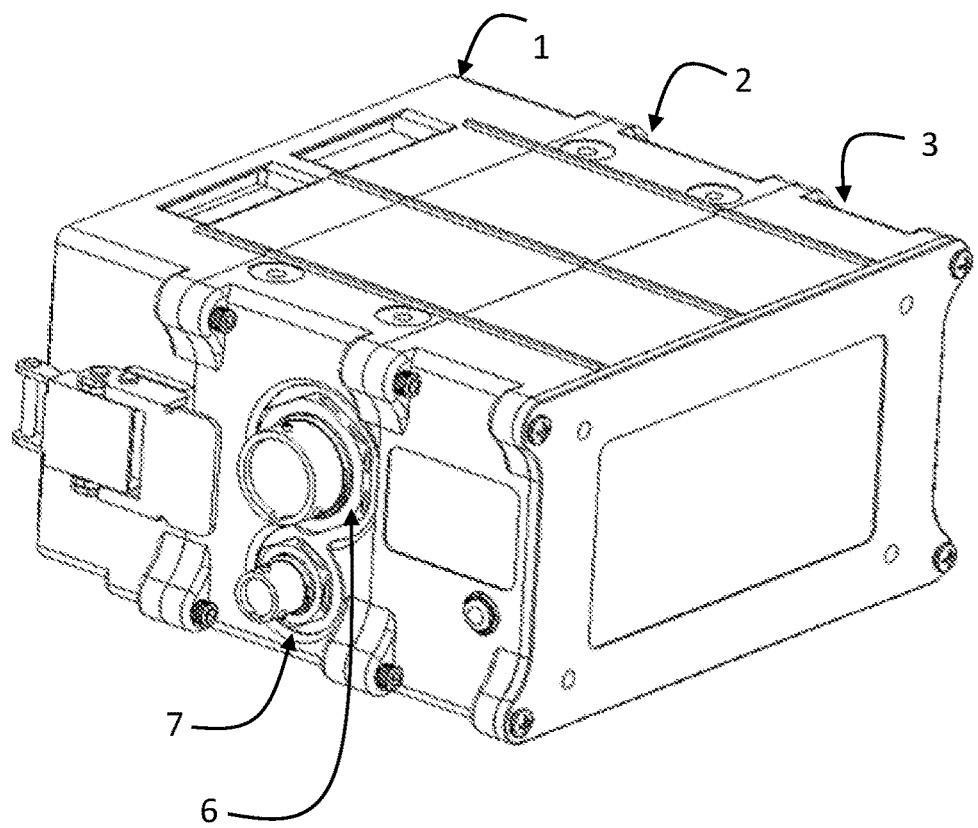
FIG. 9 is a right rear elevation view.
Figure 10:
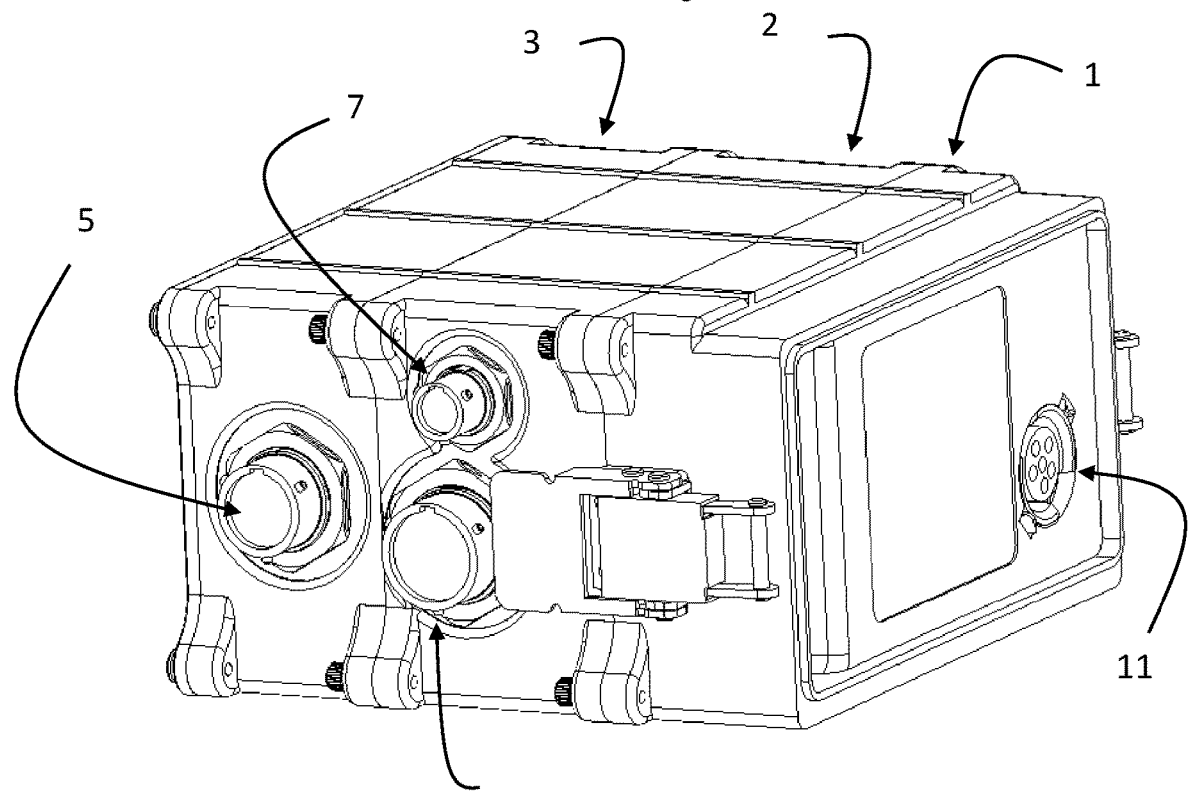
FIG. 10 is a front right elevation view.

Referring now to FIG. 9 the first DC module 2 is positioned with connectors DC input 6, and auxiliary output 7 on the right hand side while AC module 3 connector AC input 5 remains on the left side with AC power input from the left hand side with DC power input, connector 6, from the right hand side, and auxiliary power output, 7, from the right hand side. Referring now to FIG. 10, all power connectors, 5,6,7 are on the left hand side for left side cable connections.

Figure 11:
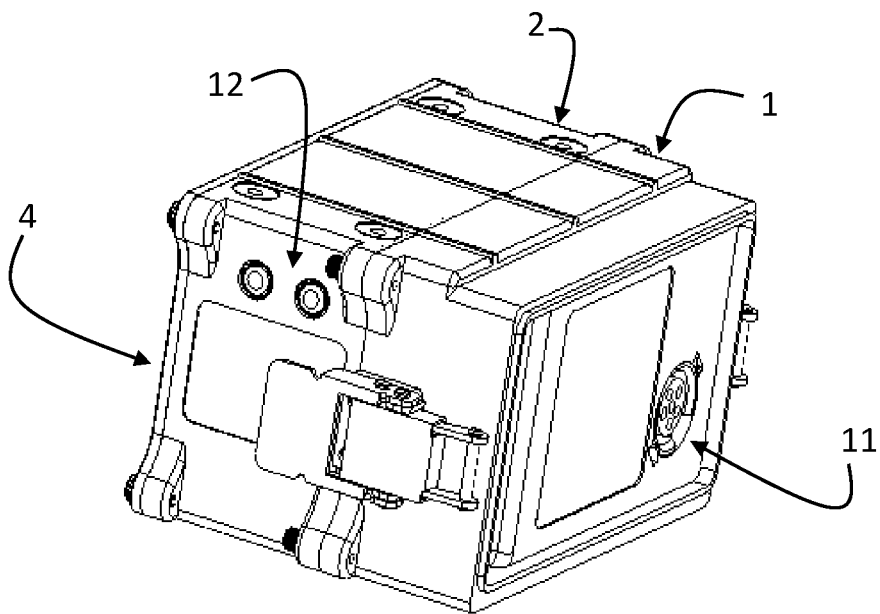
FIG. 11 is a left side module elevation view.
Figure 12:
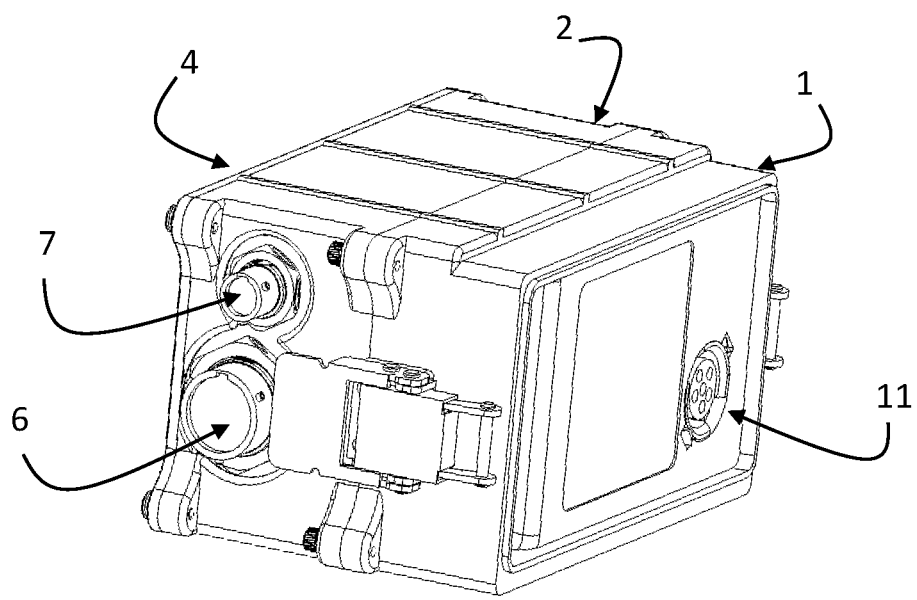
FIG. 12 is a right side module elevation view.

Referring now to FIGS. 11 and 12 the back plate 4 is attached directly to the first DC module 2. DC module 2 is affixed to the adapter plate, 1, which may attach to the AN/PRC-117F, 15, and supply DC power through the J4 DC connector, 11. The first AC module, 3, is removed, and back plate 4 is removed from AC module 3 by removing screws 14 and then attaching to DC module 2 using back plate 4 and screws 14.

Figure 13:
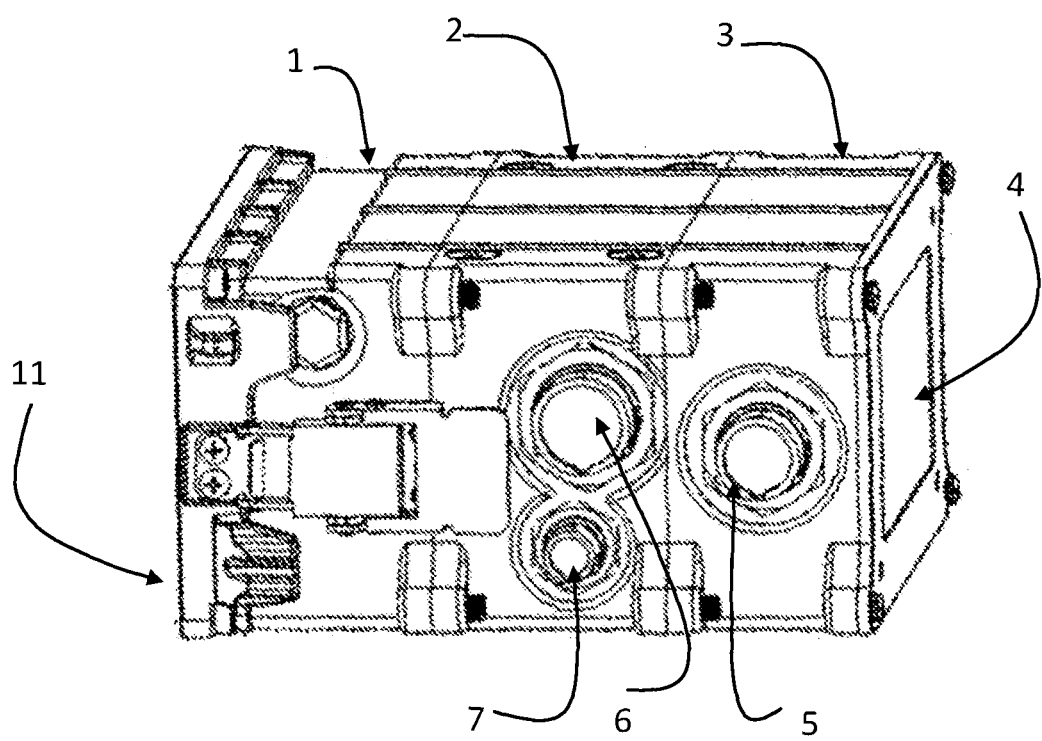
FIG. 13 is a left side elevation view.

Referring now to FIGS. 10 and 13, the first DC module, 2, is affixed to the first adapter module 1, with J4 DC output connector, 11 providing power to the AN/PRC-117G and AC Module 3 affixed to the first DC module 2, with screws 10, and containing a back plate 4, affixed with screws 14 to the first AC module 3. The first DC module 2 contains an internal battery pack, 9, which may provide backup power. Connectors AC input, 5, DC input 6, and auxiliary output, 7, are on the left side for left side cable connection. Indicator lights, 12, 13 provide visual indication of AC, DC or battery power. Referring now to FIG. 13 the first DC module 2, is affixed to the first AC module 3, and back plate 4. The assembly of DC module 2, AC module 3, and back plate 4 is rotated 180 degrees while adapter module 1 remains fixed in place with the J4 DC output connector, 11, in line with the AN/PRC-117G DC input connector.

Figure 2:
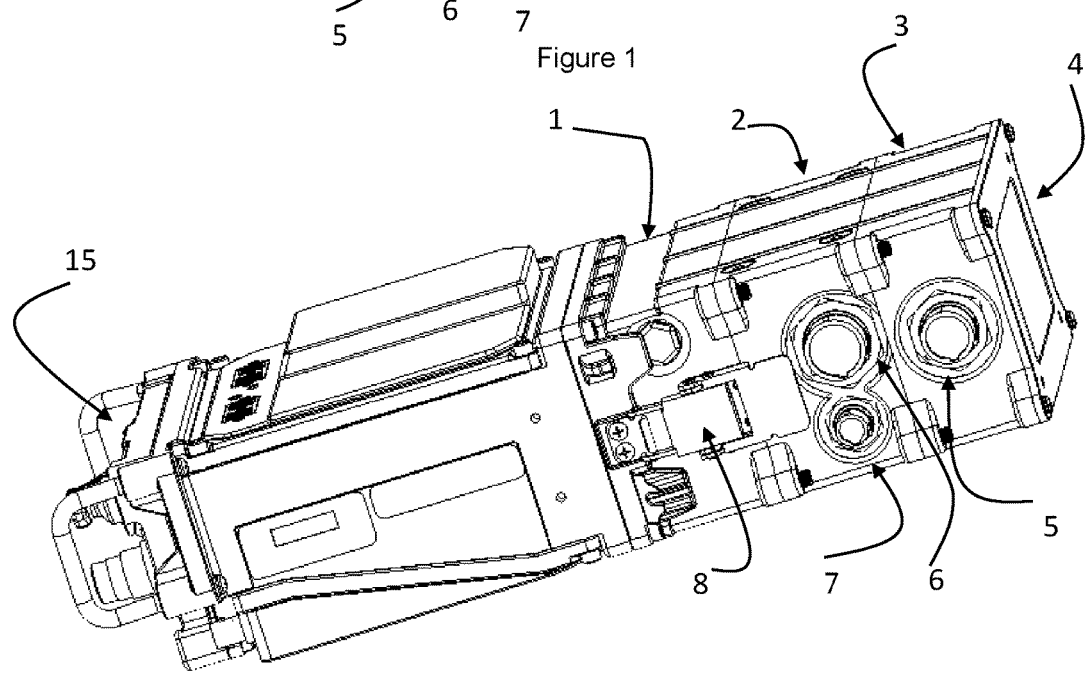
FIG. 2 is a perspective view of one embodiment of the present invention showing a Harris AN/PRC-117G radio.

Circuit boards contained within the first DC module, 2, and the first AC module 3, provide the power conversion and charging capability of the power supply. The first DC module 2, and the first AC module 3, may be used together, as depicted in FIGS. 1,2. Another embodiment of the power supply is with only the first DC module 2, and back plate 4 affixed to adapter assembly 1. Additional embodiments of the power supply allow left side, right side or both left and right side cable connections through the first AC power input, 5, the first DC power input, 6, and the first auxiliary output, 7.

While the invention is shown in several embodiments, it will be obvious to those skilled in the art that it is not so limited but is susceptible of various changes and modification without departing from the spirit thereof. For example, the adapter module, 1, allows installation of other adapter configuration to affix to radios with like power requirements including the RF-7800H-MP; RF-7800M-MP; RF-7800-RC; AN/PRC-160 and the RF-7800-RT intelligence, surveillance and reconnaissance terminal. Additionally, the power and current output specifications can easily be varied to accommodate radios with different power requirements.

Operation

Previous power supplies are of unitary design and fixed cable connectors. The present power supply, as shown in FIGS. 1 and 2 attaches to the AN/PRC-117, 15, through latches, 8, and is electrically connected by J4 DC power connector, 11 similar to existing power supplies. A significant portion of radio operations are from fixed installations such as vehicles, aircraft, vessels or command centers. In these fixed installations AC power is often not required eliminating the need for a AC conversion function within the power supply. The adaptable power supply presented allows the removal of the AC module, 3, and the affixing of the base plate 4, to the DC module 2 and the power supply can be used in a DC, or battery, only mode eliminating the AC power module which reduces the size and weight of the power supply significantly over all existing AN/PRC-117G power supplies. For applications, such as aircraft, where weight matters the reduction of size and weight is an advantage over existing power supplies.

Referring now to FIGS. 1 and 2 the ability to configure the power supply for left or right hand cable connections, or as shown in FIG. 9, both right and left hand connections, is an improvement over existing AN/PRC-117G power supplies which have fixed cable connections and cable run designs must accommodate the fixed nature of existing power supplies. The present power supply allows AC connector 5, DC connect 6, and auxiliary connect 7 to be rotated from the left side to the right side, or the DC connectors, 6, 7, may remain on the left side, or right side, while the AC connector, 5, is rotated to either the left or right side. Existing power supplies require three cable connections, with military specification connectors, in a very small amount of space which is extremely difficult to attach with fingers as these cables are typically routed underneath a vehicular or aircraft dashboard or panel, and the connections must typically be made by touch. The improved power supply presented allows the user to separate the cables and attach to either, or both, the left or right side as shown in FIG. 9.

What is claimed is:

1. A power supply assembly compromising:
    a. a first DC power module arranged for electrically powering at least one AN/PRC-117G radio;
    b. a first AC power module arranged for affixing mechanically and electrically to the first DC power module;
    c. a first adapter module affixed to the first DC module and the AN/PRC-117G radio;
    d. at least one said DC module affixed to one said adapter module which may affix to the said AN/PRC-117G radio;
    e. where the AC and DC power modules are separable electrically and mechanically;
    f. where the said DC power module is capable of providing DC power for the AN/PRC-117G radio mechanically and electrically separated from the AC power module.

2. The assembly according to claim 1 further comprised of electrical connectors.

3. The assembly according to claim 2 where the said AC module has at least one AC input connector capable of converting 85-270 VAC to DC power for the AN/PRC-117G.

4. The assembly according to claim 2 where the said DC module has at least one DC module capable of converting 9-36 VDC input power to suitable output power for the AN/PRC-117G.

5. The assembly according to claim 2 where the said adapter assembly contains a J4 output connector and mechanically and electrically attaches to the AN/PRC-117G.

6. The assembly according to claim 1 where the said DC module contains at least one battery pack capable of powering the AN/PRC-117G during power disruptions.

7. The assembly according to claim 1, where AC and DC indicator lights provide visual status of the connected power source.

8. The assembly according to claim 1, where the said AC power module contains a power converter capable of converting AC to DC power.

9. A power supply assembly capable of reconfiguring modules:
   a. where AC module, DC module and the transceiver adapter module are independent modules affixed by removable screws;
   b. where said AC module and said DC module may rotate independently from said transceiver adapter module.

10. The assembly of claim 9 wherein said DC module may rotate 180 degrees independent from said AC module and said transceiver adapter module.

11. The assembly of claim 9 wherein said AC module may rotate 180 degrees independent from said DC module and said transceiver adapter module.

12. The assembly according to claim 1, where the assembly is configured to support at least one AN/PRC-117G radio.

13. The assembly according to claim 1, where the assembly is configured to support at least one RF-7800H-MP.

14. The assembly according to claim 1, where the assembly is configured to support at least one RF-7800M-MP.

15. The assembly according to claim 1, where the assembly is configured to support at least one RF-7800-RC.

16. The assembly according to claim 1, where the assembly is configured to support at least one AN/PRC-160.

17. The assembly according to claim 1, where the assembly is configured to support at least one RF-7800-RT.

* * * * *